(12) United States Patent
Miura

(10) Patent No.: US 8,902,938 B2
(45) Date of Patent: Dec. 2, 2014

(54) METHOD TO TUNE EMISSION WAVELENGTH OF WAVELENGTH TUNABLE LASER DIODE

(71) Applicant: Sumitomo Electric Industries, Ltd., Osaka-shi (JP)

(72) Inventor: Tomoko Miura, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 14 days.

(21) Appl. No.: 13/935,185

(22) Filed: Jul. 3, 2013

(65) Prior Publication Data

US 2014/0010249 A1  Jan. 9, 2014

(30) Foreign Application Priority Data

Jul. 4, 2012 (JP) ................................. 2012-150593

(51) Int. Cl.
| | |
|---|---|
| *H01S 3/10* | (2006.01) |
| *H01S 5/06* | (2006.01) |
| *H01S 5/0625* | (2006.01) |
| *H01S 5/024* | (2006.01) |
| *H01S 5/026* | (2006.01) |
| *H01S 5/0687* | (2006.01) |
| *H01S 5/12* | (2006.01) |

(52) U.S. Cl.
CPC ................. *H01S 5/06* (2013.01); *H01S 5/0612* (2013.01); *H01S 5/06256* (2013.01); *H01S 5/02415* (2013.01); *H01S 5/0265* (2013.01); *H01S 5/0617* (2013.01); *H01L 5/06258* (2013.01); *H01S 5/0687* (2013.01); *H01S 5/1209* (2013.01); *H01S 5/1212* (2013.01)
USPC ...... 372/20; 372/25; 372/29.015; 372/29.021; 372/34

(58) Field of Classification Search
CPC ......... H01S 3/00; H01S 3/0014; H01S 3/038; H01S 3/0941; H01S 3/102; H01S 3/1028; H01S 3/1305; H01S 3/1317; H01S 5/00
USPC ............................ 372/20, 25, 29.015, 29.021
See application file for complete search history.

(56) References Cited

U.S. PATENT DOCUMENTS

| | | | |
|---|---|---|---|
| 7,362,782 B2 | 4/2008 | Ishikawa et al. | |
| 7,812,594 B2 * | 10/2010 | Ishikawa et al. | ............... 324/95 |
| 2010/0054286 A1 * | 3/2010 | Gladding | ........................ 372/21 |
| 2010/0091805 A1 | 4/2010 | Ishikawa et al. | |

FOREIGN PATENT DOCUMENTS

| | | |
|---|---|---|
| JP | 2007-273694 A | 10/2007 |
| JP | 2007-273735 A | 10/2007 |
| JP | 2007-273883 A | 10/2007 |

* cited by examiner

*Primary Examiner* — Dung Nguyen
(74) *Attorney, Agent, or Firm* — Venable LLP; Michael A. Sartori

(57) ABSTRACT

A method to tune an emission wavelength of a wavelength tunable LD is disclosed. The wavelength tunable LD includes two regions each providing micro heaters to modify the refractive index of micro regions provided with power. The method periodically detects a difference between the emission wavelength and the target wavelength. This wavelength difference is converted into power next supplied to respective micro heaters independently.

20 Claims, 4 Drawing Sheets

METHOD TO TUNE EMISSION WAVELENGTH OF WAVELENGTH TUNABLE LASER DIODE

BACKGROUND OF THE INVENTION

1. Field of the Invention

The present application relates to a method to tune an emission wavelength of a wavelength tunable laser diode (hereafter denoted as LD).

2. Related Background Art

As recent development in the wavelength division multiplexing (WDM) system, an LD installed therein as an optical signal source has been requested to tune an emission wavelength thereof precisely. A wavelength tunable LD is one of solutions for such an optical signal source. A wavelength tunable LD in an arrangement thereof provides an active region put between optical gratings each having a specific diffracting wavelength different from others, and the emission wavelength thereof may be adjusted to vary the diffracting wavelength.

Two techniques have been known to vary the diffracting wavelength of the grating, both of which vary the refractive index of the grating. The first technique changes a concentration of free carriers in the diffracting grating, while, the second technique changes a temperature there.

SUMMARY OF THE INVENTION

One aspect of the present application relates to a method to tune an emission wavelength of a wavelength tunable LD to a target wavelength. The wavelength tunable LD provides two regions each having at least one micro heater to modify refractive index of the regions. The method includes steps of detecting a wavelength difference between the emission wavelength and the target wavelength, evaluating power to compensate the wavelength difference independently for respective micro heaters, and providing thus evaluated power individually to respective micro heaters. According to embodiments of the application, respective heaters individually contributes to shift the emission wavelength, heaters are provided power for shifting the emission wavelength by a substantially even amount between heaters.

One of regions is often called as chirped sampled grating distributed Bragg reflector (CSG-DBR), while, the other region is called as sampled grating distributed feedback (SG-DFB). The CSG-DBR region inherently has a reflection spectrum with a plurality of reflection peaks, while, the SG-DFB region inherently has a gain spectrum with a plurality of gain peaks. The wavelength tunable LD emits light at a wavelength where one of the reflection peaks of the CSG-DBR coincides with one of the gain peaks of the SG-DFB; but this wavelength does not always coincide with the target wavelength. Accordingly, the heaters in the CSG-DBR and those in the SG-DFB are provides with respective specific power to shift the emission wavelength to the target wavelength.

Another aspect of the present application relates to an apparatus to emit light with a tuned wavelength. The apparatus includes a wavelength tunable LD, and a controller. The wavelength tunable LD includes a CSG-DBR with a plurality of heaters and a SG-DFB with a plurality of heaters. The CSG-DBR inherently shows a reflection spectrum accompanied with a plurality of reflection peaks and the SG-DFB inherently shows a gain spectrum accompanied with a plurality of gain peaks. The wavelength tunable LD emits light at an emission wavelength at which one of the reflection peaks coincides with one of the gain peaks. The controller includes a first part and a plurality of second parts, where each of the second parts controls respective heaters in the CSG-DBR and the SG-DFB. A feature of the apparatus of an embodiment is that the first part detects a wavelength difference between the emission wavelength and a target wavelength, and each of the second parts of the controller configures to evaluate power to be supplied to the heater from the wavelength difference detected by the first part, to convert the power into a heater current, and to provide the heater current to the heater.

BRIEF DESCRIPTION OF THE DRAWINGS

The invention will be described in conjunction with the accompanying drawings, in which.

DESCRIPTION OF THE PREFERRED EMBODIMENTS

Next, some preferred embodiments according to the present invention will be described as referring to drawings. In the description of the drawings, numerals or symbols same with or similar to each other will refer to elements same with or similar to each other without overlapping explanations.

First, an example is compared to embodiments of the present application. A wavelength tunable LD comparable to embodiments of the present application provides a heater in one of the optical gratings to adjust a local temperature, while, the wavelength tunable LD in a whole portion thereof is also controlled in a temperature thereof by an external temperature controller. Further specifically, the heater provided in one grating shifts the reflection spectrum of the optical grating to align with one of gain peaks of the other grating. Moreover, the temperature of the whole LD is adjusted to match thus aligned wavelength with a target wavelength. The target wavelength above described is, for instance, one of grid wavelengths, which is determined in the dense WDM (DWDM) standard and has a span of 50 GHz to the next grid within a wavelength range of 192 to 197 THz.

The method described above varies the temperature of the whole wavelength tunable LD to tune the emission wavelength thereof to the grid wavelength. Because the external controller adjusts the temperature of the whole wavelength tunable LD, time to tune the emission wavelength is determined by the capability of the external controller with respect to the heat capacity of the wavelength tunable LD. On the other hand, the temperature control of one of the optical gratings is carried out in shorter time, typically, done within a several tenses of microseconds because the one of the gratings inherently has a smaller heat capacity. Thus, the external temperature controller substantially determines the response of the whole wavelength tuning system.

One modification has been proposed to enhance the response of the wavelength tuning system. That is, the other optical grating is controlled in a temperature thereof by a local heater, in addition to the optical grating originally providing the micro heater, to shift a peak wavelength of the optical grating. This modified technique saves the heat consumption of the whole wavelength tunable LD and enhances the response to tune the wavelength. However, a thermal system including two micro heaters is a complex system and is hard to tune the emission wavelength precisely and stably. A comparable method described above adjusts the gain spectrum in one optical grating and the reflection spectrum in the other optical grating in the same time, which makes the control to tune the emission wavelength in simple. The modified method requires a concurrent control of two heaters, and such a system sometimes becomes unstable or occasionally causes a self-oscillation depending on set parameters, time constants of respective control loops, and so on.

Figure 1:
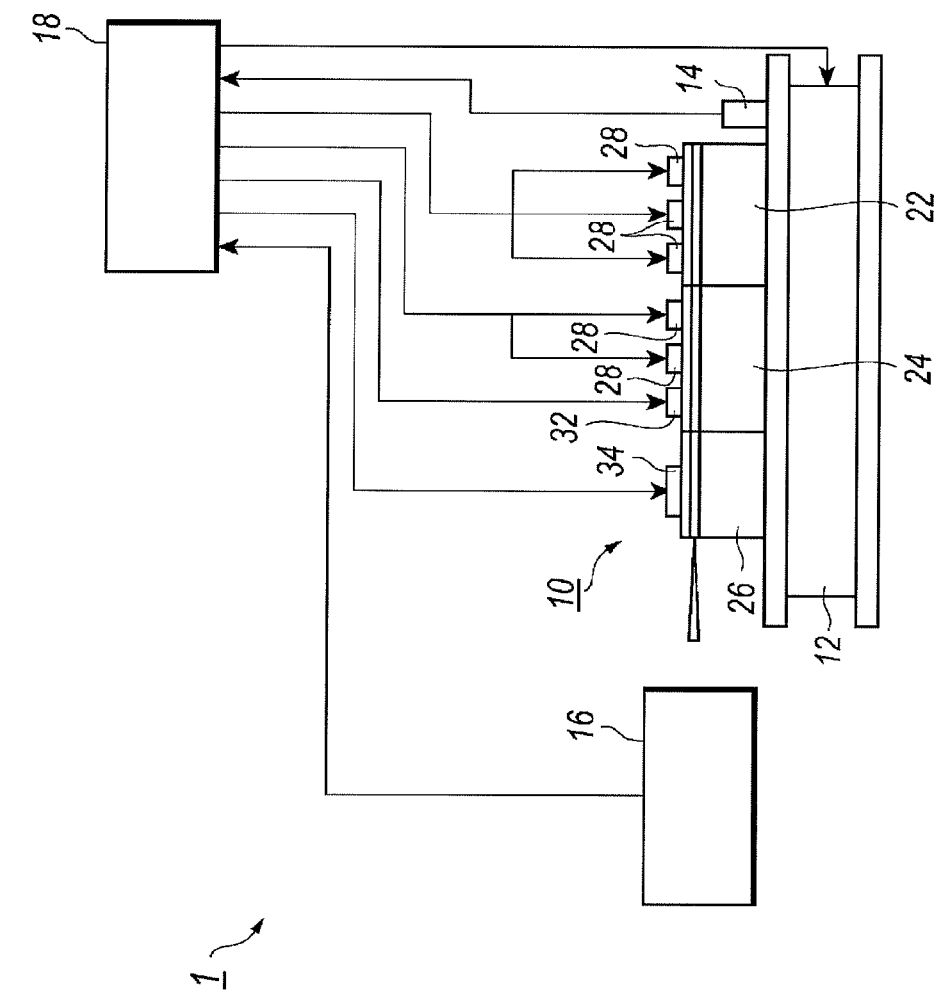
FIG. 1 is a functional block diagram of a semiconductor apparatus including a wavelength tunable LD according to an embodiment of the invention.

FIG. 1 schematically illustrates an apparatus 1 for a wavelength tunable LD 10. The apparatus 1 includes a thermo-electric cooler (hereafter denoted as TEC) 12, on which the wavelength tunable LD 10 mounted, a temperature sensor 14 typically a thermistor to sense an operating temperature of the wavelength tunable LD 10, an optical monitor 16 to monitor an output power and the wavelength of the wavelength tunable LD 10, and a controller 18 to control the output power and the wavelength of the wavelength tunable LD 10. The embodiment illustrate in FIG. 1 places the optical monitor 16 in front of the wavelength tunable LD 10, but the optical monitor 16 is able to be put in a back of the wavelength tunable LD 10.

The optical monitor 16 includes two photodiodes (hereafter denoted as PD), one of which receives light emitted from the wavelength tunable LD 10 without interposing any optical components showing wavelength depending performances, while the other detects the light through an optical component having a wavelength depending characteristic such as an etalon filter. Because the etalon filter inherently has a periodic transmittance, the PD to detect light transmitted through the etalon filter indirectly senses a wavelength shift of the light coming from the wavelength tunable LD 10. Outputs of respective PDs are provided to the controller 18.

The wavelength tunable LD 10 includes three regions, namely, the CSG-DBR region (Chirped Sampled Grating Distributed Bragg Reflector region) 22, the SG-DFB region (Sampled Grating Distributed Feedback region) 24, and the SOA region (Semiconductor Optical Amplifier region) 26, arranged along an optical axis thereof in this order. The CSG-DBR regions 22 and the SG-DFB region 24 contribute the tuning of the emission wavelength).

The CSG-DBR region 22 includes a waveguide having a plurality of optical gratings each arranged along the optical axis with a specific span and shows a transmission spectrum with a plurality of reflection peaks each being apart by a specific and constant period. This period attributed to the CSG-DBR region 22 is slightly different from a period of the gain peaks attributed to the SG-DFB region 24, which will be described later. The wavelength tunable LD 10 emits light with a wavelength at which one of the gain peaks of the SG-DFB region 24 matches with one of the reflection peaks of the CSG-DBR region 22.

The CSG-DBR region 22 provides three heaters 28 each monolithically formed on respective sub-regions in the CSG-DBR region 22. Temperatures of the sub-regions in the CSG-DBR region 22 are variable depending on power supplied to the heaters 28, which modifies the refractive index in the CSG-DBR region 22 to shift the wavelengths of the reflection peaks and align one of the reflection peaks with one of the gain peaks attributed to the SG-DFB region 24. The reflection peaks of the CSG-DBR region 22 and the gain peaks of the SG-DFB region 24 are also shifted by the operating temperature of the wavelength tunable LD 10.

The SG-DFB region 24 includes two types of sub-regions alternately arranged along the optical axis. One of types includes the optical grating, similar to the CSG-DBR region 22, along the optical axis thereof; while, the other of types includes no optical grating. The former sub-region with the optical grating is called as the gain region, while, the latter sub-region without the optical grating is called as the tuning region. The SG-DFB region 24 thus arranged shows the gain spectrum with a plurality of gain peaks each apart by a specific and constant period. The SG-DFB region 24 also provides micro-heaters 28 to shift the wavelength of the gain peaks by varying temperatures in regions accompanied with the micro-heaters depending on power supplied thereto. The gain peaks in the wavelengths thereof is varied by the operating temperature of the whole wavelength tunable LD 10. The SG-DFB region 24 further provides an electrode 32 to inject carriers in the gain region thereof.

The SOA region 26 also includes a waveguide accompanied with an electrode 34 to control the optical gain thereof. Carriers injected within the waveguide through the electrode 34 determine the optical gain thereof. The waveguide in the CSG-DBR region 22, that in the SG-DFB region 24, and that in the SOA region 26 are optical coupled with each other.

Figure 2:
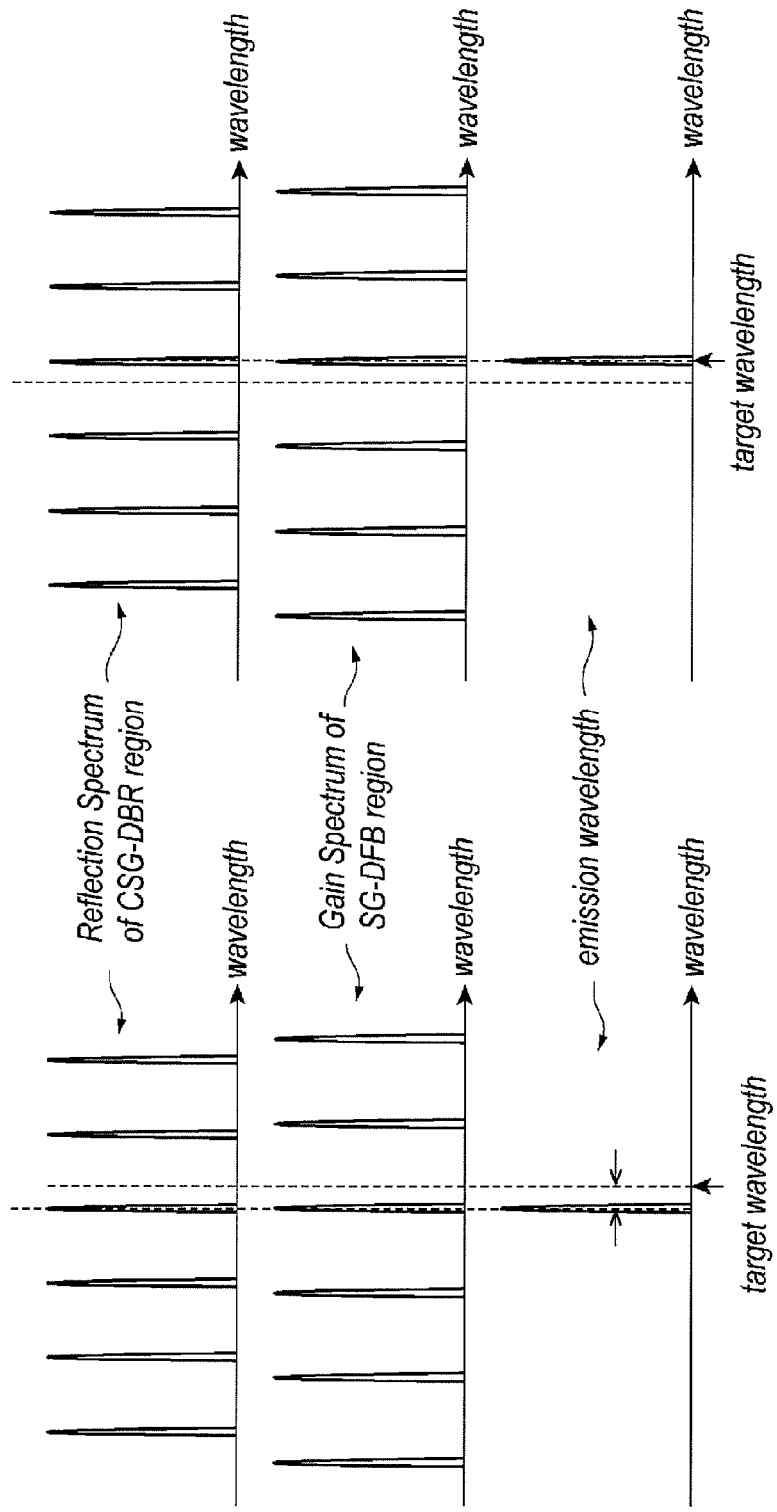
FIGS. 2A and 2B show a relation of the reflection spectrum of the CSG-DBR region, the gain spectrum of the SG-DFB region, and the emission wavelength with respect to the target wavelength.

The wavelength tunable LD 10 thus configured may tune the emission wavelength thereof by the power supplied to respective heaters 28 as keeping the operating temperature of the LD 10. FIGS. 2A and 2B show the relation between the reflection peaks of the CSG-DBR region 22, the gain peaks of the SG-DFB region 24, and the emission wavelength. As shown in FIG. 2A, supplying the preset power to respective heaters 28, the emission wavelength of the tunable LD 10 is determined at the wavelength where one of reflection peaks matches with one of gain peaks, but this emission wavelength is slightly shifted from the target wavelength.

As shown in FIG. 2B, in order to match the emission wavelength with the target wavelength without any wavelength hopping as keeping the temperature of the wavelength tunable LD 10, the reflection peaks of the CSG-DBR region 22 in the wavelength thereof is necessary to be shifted by a substantially same mount with the shift of the gain peaks of the SG-DFB region 24. When the shift amounts of respective peaks are widely different, the combination of one of the reflection peaks with one of the gain peaks to determine the emission wavelength changes during the shift operation. That is, one of reflection peaks of the CSG-DBR region 22 is combined with the next gain peaks of the SG-DFB region 24 during the shift, which causes the wavelength hopping.

As described, the shift of the reflection peaks of the CSG-DBR region 22 and that of the gain peaks of the SG-DFB region 24 depends on the power supplied to respective heaters 28. Dependence of the wavelength shift of respective heaters against the power supplied thereto, namely, $a_{HTx} = \Delta\lambda/\Delta P_{HTx}$, is determined by physical parameters of materials, dimensions and so on of the heaters 28 and regions; and respective heaters 28 have peculiar values different from others. Accordingly, in order to shift the reflection peaks and the gain peaks by the same amount $\Delta\lambda$, power supplied to the heater is necessary to be varied by $\Delta\lambda/a_{HTx}$, namely, the target shift $\Delta\lambda$ multiplied by a reciprocal of the rate $1/a_{HTx}$. Iterating the operation to vary the power to the heaters 28, the emission wavelength of the wavelength tunable LD 10 is aligned with the target wavelength, typically, one of the grid wavelengths of the WDM system without causing any wavelength hopping.

The controller 18 includes a central processing unit (CPU) to perform arithmetical operations, a memory such as RAM (random access memory) and ROM (read only memory), interfaces including analog-to-digital converters (A/D-Cs), and a power supply. The memory stores initial and target parameters for respective target wavelength of the wavelength tunable LD 10. These parameters may be stored by a look-up-table. The signals and commands of the controller 18 are provided from the interface to the heaters 28, electrodes, 32 and 34, in respective regions, 22 to 26, of the wavelength tunable LD 10.

As the initialization, the controller 18 sets the temperature of the wavelength tunable LD 10 in a preset one by controlling the TEC 12 based on the output of the temperature sensor 14, where the preset temperature of the wavelength tunable LD 10 is independent of the target wavelength. The controller 18 then set biases stored in LUT in the memory according to the target wavelength to respective heaters 28 and electrodes, 32 and 34, to make the emission wavelength of the wavelength tunable LD 10 close to or around the target wavelength. Biases are measured in advance to the practical operation of the wavelength tunable LD 10 and stored in the memory by the configuration of LUT.

In this process, the emission wavelength does not always match with the target one, or is not always set within an acceptable range around the grid wavelength ruled in the WDM system. Ambient temperature, long-term degradation of the wavelength tunable LD 10, and so on probably shift the emission wavelength thereof from the target one, even the biases are supplied thereto. The controller 18 finely tunes the emission wavelength to be equal to the target one by a feedback loop described below.

Figure 3:
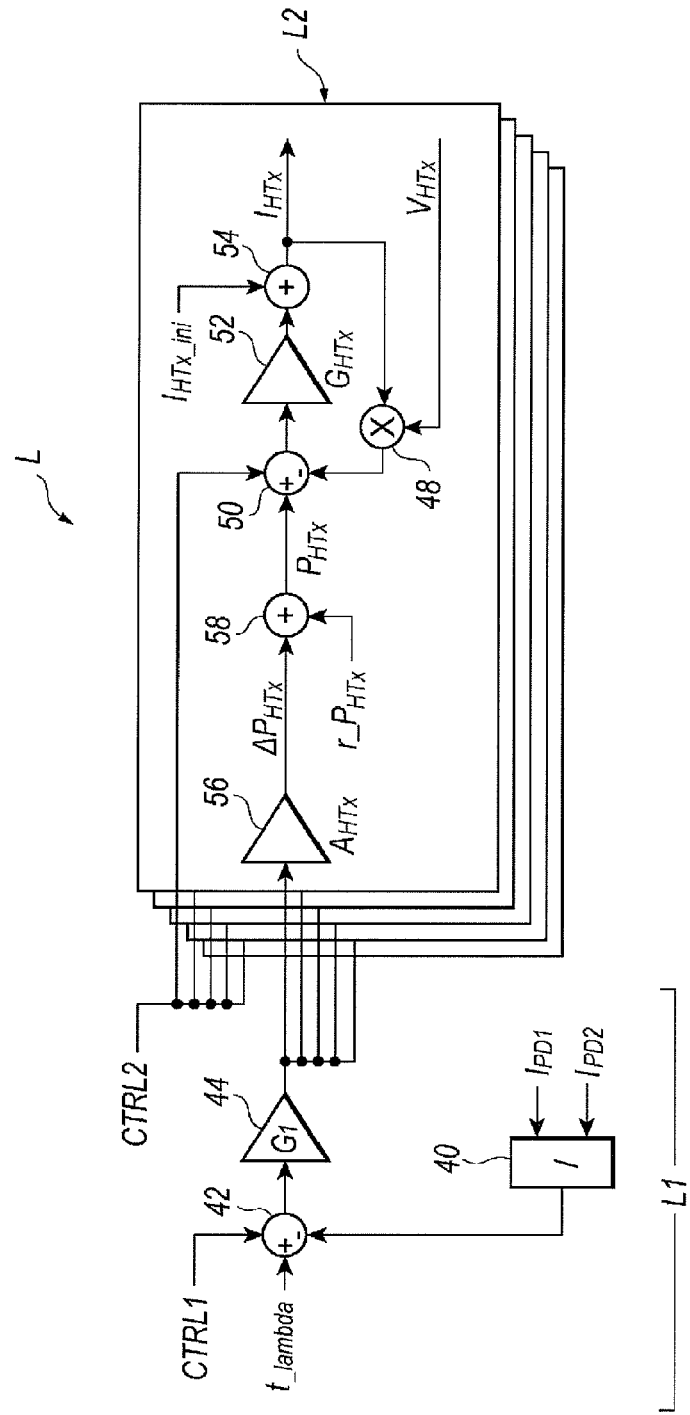
FIG. 3 is a block diagram of a controller involved in the apparatus shown in FIG. 1.

As shown in FIG. 3, which is a block diagram of the control loop, the feedback loop L of the embodiment includes the first part L1 and a plurality of second parts L2, where the number of the second parts L2 depends on the number of micro heaters 28. In the present embodiment, the wavelength tunable LD 10 provides three micro heaters 28 in the CSG-DBR region 22 and two micro heaters 28 in the SG-DFB region 24. Then, the control loop includes five (5) second parts L2. The first part L1 includes a divider 40, a subtractor 42, and an amplifier 44. The divider 40 calculates a ratio of the output $I_{PD2}$ of the second PD to that of the first PD, namely, $I_{PD2}/I_{PD1}$ is calculated by the divider 40. As described, the second PD receives light transmitted through the etalon filter. Accordingly, the ratio $I_{PD2}/I_{PD1}$ corresponds to a wavelength of light currently emitted from the wavelength tunable LD 10. The parameter $t_{\_lambda}$ corresponds to the ratio above $I_{PD2}/I_{PD1}$ when the emission wavelength is just the target wavelength. Accordingly, a difference $t_{\_lambda} - I_{PD2}/I_{PD1}$ calculated by the subtractor 42 corresponds to a shift amount of the wavelength of the light currently emitted from the target wavelength.

However, the wavelength tunable LD 10 emits no light at the beginning of the operation, which makes the ratio $I_{PD2}/I_{PD1}$ meaningless. The present embodiment provides the signal CTRL1 at the beginning of the operation to the subtractor 42 to force the output thereof in zero to stabilize the first part L1 of the control L. The amplifier 44 has a large gain, or a type of an integrator. At the beginning of the operation, the output of the amplifier 44 is forced to be zero because the output of the subtractor 42 becomes zero, which makes additional power supplemented to the reference power in the second part L2 described below.

After the wavelength tunable LD 10 practically emits light provided with biases in respective electrodes, the control loop L disables the command CTRL1 to set the subtractor 42 active. Then, the first part L1 operates to provide an output to the second part L2, where the output transferred to the second part L2 corresponds to a difference of the currently emitted wavelength at the release of the command CTRL1 and the target wavelength Δλ. Respective second parts L2 determines power corresponding to the wavelength shift Δλ calculated by a relation of $\Delta\lambda/a_{HTx}$ described above.

Specifically, each of second parts L2 includes a multiplier 48, a compensator 56, an adder 58, a subtractor 50, an amplifier 52, and an adder 54. The compensator 56 amplifies the output of the first part L1 by the gain of $A_{HTx}$ (x=1 to 5). The practical values of the gain ($A_{HTx}=1/a_{HTx}$) are stored in LUT. The output $\Delta P_{HTx}$ of the compensator 56 substantially means an amount of the power necessary to shift the present emission wavelength by Δλ. The adder 58 adds the thus calculated amount to the initial reference power $r\_P_{HTx}$. That is, the output of the adder 58, which is $P_{HTx}=r\_P_{HTx}+\Delta P_{HTx}$, becomes the next target power. The multiplier 48 multiples the current presently provided to the heater 28 with a voltage caused in the heater by the current thus provided. Because the wavelength tunable LD 10 provides the micro heaters to vary a temperature of micro areas, the wavelength tunable LD 10 is unable to monitor the temperature of the micro areas. Moreover, when only one of the parameters, the current and the voltage, is monitored, long term degradation of the heater is unable to be compensated. Accordingly, the embodiment monitors the power currently supplied to the heater by monitoring both the current flowing in the heater and the voltage caused in the heaters.

The subtractor 50 subtracts the current power calculated by the multiplier 48 from the output $P_{HTx}$ of the adder 58, which is the current target power. That is, the output of the subtractor 50 corresponds to a difference between the current power and the current target power to be supplied to the heater 28. The amplifier 52 amplifiers the difference thus calculated by the gain $G_{HTx}$, or the amplifier 52 operates as the power-to-current converter by the conversion factor of $G_{HTx}$. The output of the amplifier 52, which is an increment or a decrement of the current and is not an absolute value, is a deviation measured from the initial current $I_{HTx\_ini}$ by the adder 54. Thus, the adder 54 outputs the current $I_{HTx}$ to be next provided to the heater. In the beginning of the operation, the command CTRL2 forces the output of the subtractor 50, and resultantly that of the amplifier 52 to be zero, which means the increment or decrement of the heater current is to be zero; accordingly, the initial current $I_{HTx\_ini}$ is directly output from the second part L2.

Setting the initial heater current $I_{HTx\_ini}$ in respective heaters by the second part L2, the controller 18 resets the command CTRL2 to operate the subtractor 50 practically. Specifically, a current $I_{HTx}$ calculated from the power currently provided to the heater 28 and the power to be next supplied to the heater to shift the peak wavelengths is output from the amplifier 52.

The parameter first transferred from the first part L1 to the second ones L2 is the difference of the wavelength currently emitted from the wavelength tunable LD 10 from the initial wavelength set at the release of the command CTRL1. While, the relations between the variation of the power to be supplied to the heater and that of the emission wavelength, which is denoted as $a_{HTx}$, are stored as LUT in the memory. When this relation is set in the second part L2 by the first part L1, the variation of the power from the power initially supplied to the heater is calculated in the second part L2, and the second part L2 outputs the current to the heater corresponding to thus calculated power.

A practical operation of the apparatus 1 will be described. The controller 18 first provides various initial currents, $I_{DFB\_ini}$, $I_{SOA\_ini}$, and $I_{HTx\_ini}$, corresponding to the target emission wavelength to respective regions, 22 to 26, to operate the wavelength tunable LD 10. These initial parameters are store in LUT of the memory. The initial current $I_{DFB\_ini}$ is to be provided to the SG-DFB region 24, the current $I_{SOA\_ini}$ is to be set in the SOA region 26, and the current $I_{HTx\_ini}$ is to be provided to the micro heaters 28 in the CSG-DBR region 22 and the SG-DFB region 24. For the initial heater current $I_{HTx\_ini}$, the commands, CTRL1 and CTRL2 are set to kill the feedback operation of the first part L1 and the second part L2. Further, the controller 18 reads from LUT the target values $t\_{lambda}$ for the ratio of two outputs of PDs, $I_{PD2}/I_{PD1}$ and the reference values $r\_P_{HTx}$ for the power initially supplied to the heaters.

Setting the parameters for the target wavelength, the wavelength tunable LD 10 emits light with a wavelength close to or around the target wavelength. The ratio $I_{PD2}/I_{PD1}$ of two PDs becomes close to the target $t\_{lambda}$ thereof.

Releasing the commands, CTRL1 and CTRL2, which activates the operation of the first and second parts, L1 and L2, the wavelength tuning is practically operated. The controller 18 sets the gain $A_{HTx}$, or the conversion efficiency of the amplifier 56 for the variation $\Delta\lambda$ of the emission wavelength from the target wavelength, in advance to the practical operation of the second part L2. That is, the gain or the conversion efficiency $A_{HTx}$ is given by the reciprocal of the conversion factor $a_{HTx}$ connecting the variation of the wavelength $\Delta\lambda$ to the variation of the heater power $\Delta P$. Adding the reference power $r\_P_{HTx}$ to the variation power $\Delta P$ thus converted by the amplifier 56, the target power next provided to the heater 28 is set such that respective heaters causes the same amount of the wavelength shift. Iterating the operation of the first and second parts, L1 and L2, the practical emission wavelength stably converges into the target wavelength without accompanying with wavelength hopping.

The controller 18 may vary a time constant of respective second parts L2 to provide the currents to the heater 28 for equalizing the response time of respective regions. The response time of the second part L2 may be adjusted by, for instance, varying a sampling period of the second part L2. Specifically, one example adds the differential power to the initial power by the adder 58 digitally, and adjusts the period of the discrete operation of the adding. Another example may vary the closed loop gain of the second part L2.

Moreover, the controller 18 sets the time constant to operate the first part L1 longer than the time constant of the second part L2. Because the second part L2 operates so as to equalize the power supplied to respective heater with the respective target power. Thus, the operation or the convergence of the heater power is different from others, which causes a time lag until all heaters 28 are converged in the target heater power. The present wavelength tunable LD 10 has the micro heaters 28 and the heat capacity to be controlled by the micro heaters are small enough; accordingly, the thermal response of the regions is short enough. A condition where the time constant of the first part L1 is longer than the time constants of the second part L2 is the only necessary. Shortening the time constant for the first part L1, which means that the target power for the second part L2 varies before the power becomes stable in the target power, the second part L2 resultantly becomes unstable.

Specifically, the embodiment sets the loop gain of the first part L1 less than the loop gain of the second part L2. The response of the first part L1 strongly depends on the gain $G_1$ of the amplifier 44, while, the gain $G_{HTx}$ of the amplifier 52 dominates the response of the second part L2. Accordingly, the response of respective parts, L1 and L2, may be simply adjusted by the gains, $G_1$ and $G_{HTx}$, of respective amplifiers, 44 and 52. Because the gain $A_{HTx}$ of the amplifier 56 in respective second parts L2 are adjusted so as to equalize the variation of the wavelength by respective heaters and this gain $A_{HTx}$ is the reciprocal of the shift of the wavelength against the variation of the heater power, which sets the time from the set of the output of the amplifier 44 in the first part L1 to the practical shift in the wavelength in substantially equal for respective heaters, the control of the emission wavelength may be stably and promptly carried out.

The closed loop gain is adjustable by the sampling period. Accelerating the sampling of the second part L2, namely, sampling the heater current and voltage, with respect to the sampling of the first part L1, namely, the output of two PDs, $I_{PD1}$ and $I_{PD2}$, the second part L2 makes the heater power close to or equal to the target power before the first part L1 sets the new target power. Thus, the emission wavelength may be stably controlled without causing the wavelength hopping.

Next, an evaluation of the gain $G_{HTx}$ of the amplifier 52 will be described, where the gain $G_{HTx}$ determines the loop gain of the second part L2.

The heater current $I(k)$, which is the output of the second part L2, is determined by:

$$I(k) = G \cdot \Sigma_k \{P - a(k-1)\} + I_0, \text{ and}$$

$$a(k) = I^2(k) \cdot R,$$

where $I_0$, $a(k)$, $G$, $I(k)$, and $P$, are the initial current, the power next supplied to the heater, the gain of the amplifier 52, the current to be supplied to the heater, and the reference power, respectively. Assuming that no current is initially supplied, namely $I_0 = 0$, and the closed loop of the second part L2 is digitally carried out, the heater current $I(k)$ and the heater power $a(k)$ for respective round k are given in the following table.

| round k | I(k) | a(k) |
| --- | --- | --- |
| 0 | 0 | 0 |
| 1 | $P \cdot G - a(0) = P \cdot G$ | $= I^2(1) \cdot R$ |
| | | $= P^2 \cdot G^2 \cdot R$ |
| 2 | $G \cdot \{P - a(1) + P - a(0)\} = G \cdot (P - P^2 \cdot G^2 \cdot R) + P \cdot G$ | $I^2(2) \cdot R = \{P \cdot G \cdot (2 - P \cdot G^2 \cdot R)\}^2 \cdot R$ |
| | $= P \cdot G \cdot (2 - P \cdot G^2 \cdot R)$ | $= (2 - P \cdot G^2 \cdot R)^2 \cdot P^2 \cdot G^2 \cdot R$ |
| n | $F(\alpha) \cdot P \cdot G$, $\alpha = P \cdot G^2 \cdot R$ | $I(n)^2 \cdot R = F^2(\alpha) \cdot P^2 \cdot G^2 \cdot R$ |
| | | $= F^2(\alpha) \cdot \alpha \cdot P$ |

-continued

| round k | I(k) | a(k) |
|---|---|---|
| n + 1 | $(P - F^2(\alpha) \cdot \alpha \cdot P) \cdot G + F(\alpha) \cdot P \cdot G =$ $(1 + F(\alpha) - F^2(\alpha) \cdot \alpha) \cdot P \cdot G$ | $(1 + F(\alpha) - F^2(\alpha) \cdot \alpha)^2 \cdot \alpha \cdot P$ |

From the relations above listed, the ratio of the power a(k) to be supplied to the heater at the round k against the reference power P, a(k)/P, becomes:

$$a(k)/P = (1 + F(\alpha) - F^2(\alpha) \cdot \alpha)^2 \cdot \alpha.$$

Thus, the ratio a(k)/P is given by a function of only $\alpha = P \cdot G^2 \cdot R$. Accordingly, in order to make the response of respective heaters 28 even, the gain G of the amplifier 52 is adjusted so as to equalize the parameter $\alpha$ ($= P \cdot G^2 \cdot R$) in respective second parts L2.

That is, the gain of the amplifier 52 in respective second parts L2 is set so as to satisfy the relations of;

$$t\_P_{HT1} \cdot G^2_{HT1} \cdot R_{HT1} = t\_P_{HT2} \cdot G^2_{HT2} \cdot R_{HT2}$$
$$= t\_P_{HT3} \cdot G^2_{HT3} \cdot R_{HT3}$$
$$= t\_P_{HT4} \cdot G^2_{HT4} \cdot R_{HT4}$$
$$= t\_P_{HT5} \cdot G^2_{HT5} \cdot R_{HT5}$$
$$= \alpha.$$

In equations above, the resistance R of respective heaters is not adjustable because the micro heaters 28 are monolithically formed in the wavelength tunable LD 10. Accordingly, in order to shift the emission wavelength homogeneously depending on respective heaters 28, the loop gain of respective second parts L2, or the gain of the amplifier 52 in respective second parts L2, may be set to be $G_x = \sqrt{(\alpha/P/R_x)}$, where x=1 to 5.

The parameter $\alpha$ is less than unity (1), or preferably less than 0.9. Smaller $\alpha$ enhances the stability of the second part L2 but it takes longer time to stable the second part L2. The parameter $\alpha$ greater than unity enhances the possibility of an excess shift in the emission wavelength. Accordingly, $\alpha$ greater than 0.8 but less than 0.9 may make the stability of the operation consistent with an enhanced convergence.

The analysis above described assumes no initial heater current, $I_0 = 0$. However, a substantial initial heater current is supplied in a practical operation of the wavelength tunable LD 10. The substantial initial heater current $I_0$ affects the convergence of the second part L2, in particular, the first round of the digital operation. In such a case, initial currents for respective heaters 28 are set so as to satisfy the relation of $$I^2_{0\_HT1} \cdot R_{HT1} / P_{HT1} = I^2_{0\_HT2} \cdot R_{HT2} / P_{HT2}$$
$$= I^2_{0\_HT3} \cdot R_{HT3} / P_{HT3}$$
$$= I^2_{0\_HT4} \cdot R_{HT4} / P_{HT4}$$
$$= I^2_{0\_HT5} \cdot R_{HT5} / P_{HT5}$$
$$= \alpha,$$

where $I_{0\_HTx}$ is the initial current for the micro heater x.

The description above assumes that respective second parts L2 evenly respond to the target wavelength shift defined by the first part L1. However, the second parts L2 are not always necessary to show the exact evenness. The second parts L2 are requested to show responses similar to each other. A key feature is that the response of the first part L1 shows the response longer than responses of the second parts L2.

According to the one embodiment of the present application, a method to tune the emission wavelength of a wavelength tunable LD 10 that provides the CSG-DBR region 22 and the SG-DFB region 24 for tuning the emission wavelength thereof includes steps of: monitoring a deviation of the emission wavelength from the target wavelength repeatedly by the first part L1, converting this wavelength deviation into differential power, and supplying power combining this differential power added with the initial power to respective heaters 28 in the CSG-DBR regions 22 and the SG-DFB region 24. Thus, by setting the time constant of the first part L1 and that of the second parts L2, the emission wavelength of the wavelength tunable LD 10 shifts to the target wavelength stable without accompanying with the wavelength hopping.

The differential power above described is derived for respective heaters by multiplying the necessary wavelength shift by a reciprocal of the wavelength dependence for the increment of the unit power for the heater. That is, the heaters 28 are supplied with the power so as to cause the same wavelength shift; accordingly, no wavelength hopping appears during the operation.

The second part L2 has a variable time constant, or a variable closed loop gain; accordingly, the response of the first part L1 and that of the second part L2 are independently set. Moreover, the response of the first loop L1 is set longer compared with those of the second parts L2, the emission wavelength of the wavelength tunable LD 10 is stably set in the target wavelength.

Figure 4:
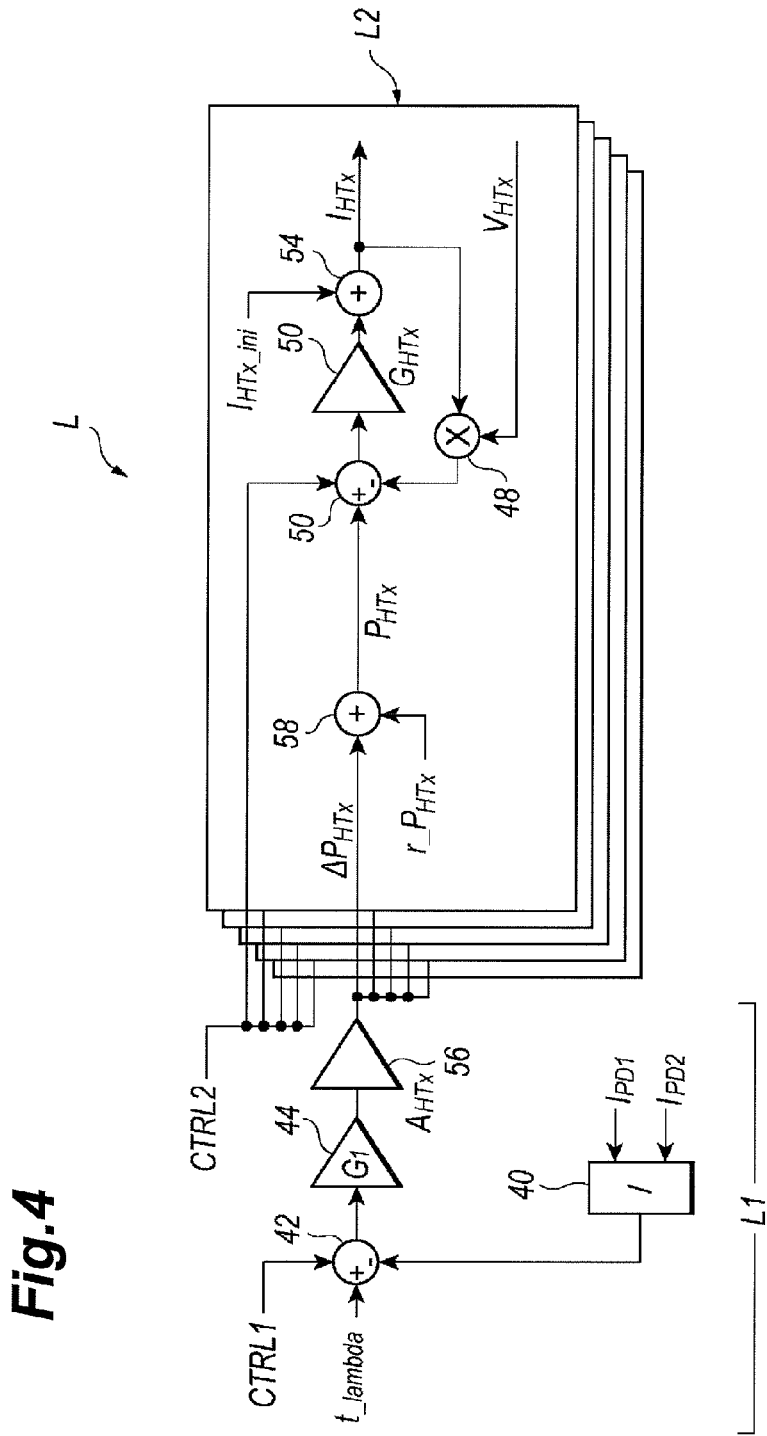
FIG. 4 is a block diagram of the controller according another embodiment of the application.

Although the invention thus described as explaining an embodiment thereof, the invention is not restricted to such embodiments. The embodiment shown in FIG. 3 provides the amplifier 56 that converts the detected wavelength shift into necessary power difference in respective second parts L2. However, the relations of the wavelength shift against the power for respective heaters are not widely different from others, the first part L1 puts the amplifier 56 in the output thereof and the second loop L2 may omit the amplifier. FIG. 4 shows such an arrangement to omit the amplifier 56 in the second parts L2.

What is claimed is:

1. A method to tune an emission wavelength of a wavelength tunable laser diode (LD) to a target wavelength, the wavelength tunable LD providing two regions each having at least one micro heater to modify refractive index of respective regions, the method comprising steps of
   detecting a wavelength difference between the emission wavelength and the target wavelength;
   evaluating power to compensate the wavelength difference independently for respective micro heaters; and
   providing power to respective micro heaters.

2. The method of claim 1,
wherein the step to detect the wavelength difference is carried out by a first part of a control, and the step to evaluate the power and provide the power are carried out by second parts of the control, each of second parts being independently provided for respective micro heaters, and
wherein the first part has a response, from a detection of the emission wavelength to evaluate the wavelength difference, longer than responses of respective second parts from a reception of the wavelength difference from the first part to output the power to respective micro heaters.

3. The method of claim 2,
wherein each of the second parts has a variable gain.

4. The method of claim 3,
wherein each of second parts has a conversion gain of a reciprocal of a wavelength shift when the micro heater corresponding to each of the second parts is provided with unit power.

5. The method of claim 4,
wherein the amplifiers in each of the second parts have the conversion gain defined by $\sqrt{(\alpha/R/P)}$, where P is initial power first supplied to the micro heater, R is resistance of the micro heater, and $\alpha$ is a parameter corresponding to the conversion gain of each of the second parts.

6. The method of claim 5,
wherein the parameter is greater than 0.8 but less than 0.9.

7. The method of claim 2,
wherein each of the second parts has a variable response.

8. The method of claim 7,
wherein the first and second parts are digitally performed, and
wherein the first part has a sampling period of the emission wavelength longer than a sampling period of the power supplied to the micro heater by the second part.

9. A method to tune an emission wavelength of a wavelength tunable laser diode (LD) to a target wavelength, the wavelength tunable LD comprising a chirped sampled grating distributed Bragg reflector (CSG-DBR) with a plurality of heaters and a sampled grating distributed feedback (SG-DFB) with a plurality of heaters, where the CSG-DBR has a reflection spectrum including a plurality of reflection peaks and the SG-DFB has a gain spectrum with a plurality of gain peaks, one of the reflection peaks and one of the gain peaks coinciding with the emission wavelength, the reflection peaks and the gain peaks shifting as varying power supplied to respective heaters in the CSG-DBR and the SG-DFB, the method comprising steps of:
detecting a wavelength difference between the emission wavelength and the target wavelength by a first part of a control;
evaluating power to be supplied to respective heaters in the CSG-DBR and the SG-DFB to compensate the wavelength difference; and
providing the power to respective heaters,
wherein the power supplied to the heaters in the CSG-DBR shifts the reflection peaks and the power supplied to the heaters in the SG-DFB shifts the gain peaks by substantially same amount with the shift of the reflection peaks.

10. The method of claim 9,
wherein the evaluation of the power is carried out by second parts prepared for respective heaters independently.

11. The method of claim 10,
wherein each of the second parts of the control has a conversion gain different from others, the conversion gain being a reciprocal of a wavelength shift when the micro heater is provided with unit power.

12. The method of claim 11,
wherein the conversion gain of each of the second parts is set to be $\sqrt{(\alpha/R/P)}$, where P is initial power first supplied to the heater, R is resistance of the heater, and $\alpha$ is a parameter corresponding to the conversion gain of respective second parts from the wavelength shift to the power.

13. The method of claim 12,
wherein the parameter $\alpha$ is greater than 0.8 but less than 0.9.

14. The method of claim 9,
wherein the power to be supplied to the heaters are substantially equal for respective heaters.

15. A semiconductor apparatus to emit light with a tuned wavelength, comprising:
a wavelength tunable laser diode (LD) including a chirped sampled grating distributed Bragg reflector (CSG-DBR) with a plurality of heaters and a sampled grating distributed feedback (SG-DFB) with a plurality of heaters, the CSG-DBR showing a reflection spectrum with a plurality of reflection peaks, the SG-DFB showing a gain spectrum with a plurality of gain peaks, wherein the wavelength tunable LD emits light at an emission wavelength at which one of the reflection peaks coincides with one of the gain peaks; and
a controller including a first part and a plurality of second parts each corresponding to respective heaters in the CSG-DBR and the SG-DFB,
wherein the first part detects a wavelength difference between the emission wavelength and a target wavelength, and
wherein each of the second parts evaluates power to be supplied to the heater from the wavelength difference provided from the first part, converts the power into a heater current, and provides the heater current to the heater.

16. The apparatus of claim 15,
further comprising an optical monitor including first and second photodiodes, the first photodiode detecting light output from the wavelength tunable LD directly and the second photodiode detecting light output from the wavelength tunable LD and transmitted through an optical component whose transmittance depends on a wavelength.

17. The apparatus of claim 16,
wherein the first part includes a divider, a primary subtractor, and an amplifier, the divider calculating a ratio of the output of the second photodiode against the output of the first photodiode to evaluate the emission wavelength, the primary subtractor subtracting the ratio from a target ratio corresponding to the target wavelength, the amplifier providing an output of the first part by amplifying an output of the primary subtractor, and
wherein each of the second parts includes a first amplifier, a first adder, a secondary subtractor, a second amplifier, a second adder, and a multiplier, the first amplifier amplifying the output of the first part by a gain specific to respective second parts, the gain being a reciprocal of a wavelength shift when the micro heater is provided with unit power, the first adder adding an output of the first amplifier with a reference power, the output of the first adder corresponding to the power to compensate the wavelength difference, the secondary subtractor subtracting an output of the first adder by an output of the multiplier, the second amplifier converting an output of the secondary subtractor into a current, the second adder adding the current output from the second amplifier with an initial current specific to respective second parts, the multiplier multiplying a current output from the second adder with a voltage caused in respective heaters by flowing the current output from the second adder.

18. The apparatus of claim 17,
wherein the gain of the second amplifier in respective second parts is set to be $\sqrt{(\alpha/R/P)}$, where R is resistance of the heater, P is the reference power, and $\alpha$ is a parameter corresponding to a conversion gain of respective second parts from the wavelength difference to the power.

19. The apparatus of claim 18,
wherein the parameter $\alpha$ is greater than 0.8 but less than 0.9.

20. The apparatus of claim 17,
wherein the primary subtractor initially outputs zero and each of the secondary subtractor in respective second parts initially outputs zero,
wherein each of the second parts initially outputs the initial current specific to respective second parts.

* * * * *